United States Patent
Chen et al.

(10) Patent No.: US 12,284,835 B2
(45) Date of Patent: Apr. 22, 2025

(54) CONDUCTIVE INTERCONNECTION MEMBER OF IMBRICATE ASSEMBLY, IMBRICATE ASSEMBLY, AND MANUFACTURING METHOD

(71) Applicant: LONGI SOLAR TECHNOLOGY (TAIZHOU) CO., LTD., Jiangsu (CN)

(72) Inventors: Jun Chen, Jiangsu (CN); Hua Li, Jiangsu (CN); Jiyu Liu, Jiangsu (CN)

(73) Assignee: LONGI SOLAR TECHNOLOGY (TAIZHOU) CO., LTD., Jiangsu (CN)

( * ) Notice: Subject to any disclaimer, the term of this patent is extended or adjusted under 35 U.S.C. 154(b) by 74 days.

(21) Appl. No.: 17/920,666

(22) PCT Filed: Nov. 6, 2020

(86) PCT No.: PCT/CN2020/127006
§ 371 (c)(1),
(2) Date: Oct. 21, 2022

(87) PCT Pub. No.: WO2022/000913
PCT Pub. Date: Jan. 6, 2022

(65) Prior Publication Data
US 2023/0146682 A1     May 11, 2023

(30) Foreign Application Priority Data
Jun. 30, 2020    (CN) .......................... 202010617139.6

(51) Int. Cl.
*H10F 19/90*      (2025.01)
(52) U.S. Cl.
CPC ......... *H10F 19/904* (2025.01); *H10F 19/908* (2025.01)
(58) Field of Classification Search
CPC .................... H01L 31/0508; H01L 31/0516
See application file for complete search history.

(56) References Cited

U.S. PATENT DOCUMENTS

| | | | | |
|---|---|---|---|---|
| 3,769,091 A | * | 10/1973 | Leinkram | ............. H01L 31/042 136/246 |
| 2014/0124014 A1 | * | 5/2014 | Morad | ................ H01L 31/0504 136/246 |

(Continued)

FOREIGN PATENT DOCUMENTS

| CN | 104205356 A | 12/2014 |
|---|---|---|
| CN | 104205365 A | 12/2014 |

(Continued)

OTHER PUBLICATIONS

PCT/CN2020/127006 international search report, Mar. 29, 2021.
EP 20943075.0 extended European search report, Mar. 19, 2024.
CN202010617139.6 first office action dated Nov. 30, 2024.

*Primary Examiner* — Jayne L Mershon
(74) *Attorney, Agent, or Firm* — IPro, PLLC

(57) ABSTRACT

A conductive interconnection member includes: a conductive layer (1), and an insulating layer (4) and electrical connectors (2) located on one side of the conductive layer (1). The conductive layer (1) is provided with a conductive circuit; the insulating layer (4) is provided with openings (41), and the electrical connectors (2) are located in the openings (41) of the insulating layer (4); the electrical connectors (2) include a first electrical connector (21) and a second electrical connector (22); the first electrical connector (21) is used to be electrically connected to a first electrode (31) of a back contact solar cell (3) and the conductive circuit; the second electrical connector (22) is used to be electrically connected to a second electrode (32) of a back contact solar cell (3) and the conductive circuit; and the polarities of the first electrode (31) and the second electrode (32) are opposite.

17 Claims, 4 Drawing Sheets

(56) References Cited

U.S. PATENT DOCUMENTS

| | | | |
|---|---|---|---|
| 2016/0268964 A1* | 9/2016 | Maekawa | H01L 31/0488 |
| 2019/0081198 A1* | 3/2019 | Morad | H01L 31/0508 |
| 2019/0081589 A1* | 3/2019 | Woo | H01L 31/0475 |

FOREIGN PATENT DOCUMENTS

| | | | |
|---|---|---|---|
| CN | 110246919 A | 9/2019 |
| CN | 110707170 A | 1/2020 |
| CN | 209993611 U | 1/2020 |
| CN | 111785800 A | 10/2020 |
| CN | 212934635 U | 4/2021 |
| EP | 2312641 A1 | 4/2011 |
| EP | 2833416 A1 | 2/2015 |
| GB | 2524327 A | 9/2015 |
| WO | 2017156631 A1 | 9/2017 |
| WO | 2019059508 A1 | 3/2019 |
| WO | 2020071083 A1 | 4/2020 |
| WO | 2020121694 A1 | 6/2020 |

\* cited by examiner

CONDUCTIVE INTERCONNECTION MEMBER OF IMBRICATE ASSEMBLY, IMBRICATE ASSEMBLY, AND MANUFACTURING METHOD

The present application claims the priority of the Chinese patent application filed on Jun. 30, 2020 before the Chinese Patent Office with the application number of 202010617139.6 and the title of "CONDUCTIVE INTERCONNECTION MEMBER OF IMBRICATE ASSEMBLY, IMBRICATE ASSEMBLY, AND MANUFACTURING METHOD", which is incorporated herein in its entirety by reference.

TECHNICAL FIELD

The present disclosure relates to the technical field of photovoltaics and more particularly, to an electrically conducting interconnector of a shingled module, a shingled module and a fabricating method.

BACKGROUND

For back-contacting solar cells, because there is on electrode provided at the light facing face, they may reduce the light shielding, increase the short-circuit current of the cells, and have a better appearance. Therefore, they have extensive applications.

By overlapping part of the back-contacting solar cells to form a shingled module, the power output of the assembly may be increased, and the assembly may have a better appearance.

However, in the formation of the shingled module from the back-contacting solar cells, the process is complicated because all of the electrodes are arranged at the shadow face.

SUMMARY

The present disclosure provides an electrically conducting interconnector of a shingled module, a shingled module and a fabricating method, which aims at solving the problem of the complicated conventional process of forming a shingled module by using back-contacting solar cells.

According to the first aspect of the present disclosure, there is provided an electrically conducting interconnector of a shingled module, wherein the electrically conducting interconnector includes: an electrically conductive layer, and an insulating layer and electric connectors that are located on one side of the electrically conductive layer;
  the electrically conductive layer is provided with an electrically conducting circuit;
  the insulating layer is provided with openings, and the electric connectors are located in the openings of the insulating layer;
  the electric connectors include a first electric connector and a second electric connector;
  the first electric connector is configured for conductively connecting a first electrode of a back-contacting solar cell and the electrically conducting circuit;
  the second electric connector is configured for conductively connecting a second electrode of a back-contacting solar cell and the electrically conducting circuit;
  a polarity of the first electrode and a polarity of the second electrode are different;
  in an overlapping region of neighboring back-contacting solar cells, when heights of the electric connectors increase, widths of the electric connectors gradually increase, wherein the heights refer to dimensions of the electric connectors in a direction perpendicular to the electrically conductive layer; and
  a pattern of the electrically conducting circuit is configured so that the electrically conducting interconnector is capable of connecting in series a plurality of back-contacting solar cells.

In the embodiments of the present disclosure, the first electric connector located on one side of the electrically conductive layer conductively connects the first electrode of the back-contacting solar cell and the electrically conducting circuit in the electrically conductive layer, the second electric connector located on one side of the electrically conductive layer conductively connects the second electrode of the back-contacting solar cell and the electrically conducting circuit in the electrically conductive layer, wherein the polarity of the first electrode and the polarity of the second electrode are different. In other words, the first electric connector and the second electric connector are used to connect in series the back-contacting solar cells that overlap to the electrically conductive layer, to form a cell string, which has a simple process. Moreover, the electrically conducting connector located on one side of the electrically conductive layer may serve to support against an external force to a certain extent, which may increase the strength of connection, reduce the risk of cracking of the cells or the assembly, and improve the reliability of the assembly. Moreover, the back-contacting solar cells overlap, which sufficiently utilizes the limited room in the assembly, increases the output power, reduces the assembly loss, and increases the conversion efficiency of the assembly. Furthermore, the first electric connector connecting the first electrode of the back-contacting solar cell and the second electric connector connecting the second electrode of the back-contacting solar cell are located in the openings of the insulating layer, and the first electrode and the second electrode are further electrically isolated by the insulating layer not provided with an opening, which may avoid a short circuit between the first electrode and the second electrode. The insulating layer may also serve to support against an external force to a certain extent, which may increase the strength of connection, reduce the risk of cracking of the cells or the assembly, and improve the reliability of the assembly.

According to the second aspect of the present disclosure, there is provided a shingled module, wherein the shingled module includes at least two back-contacting solar cells that overlap;
  the first electrode of the back-contacting solar cell and the electrically conducting circuit of the electrically conducting interconnector stated above are conductively connected by the first electric connector of the electrically conducting interconnector of the shingled module stated above;
  the second electrode of the back-contacting solar cell and the electrically conducting circuit are conductively connected by the second electric connector of the electrically conducting interconnector of the shingled module stated above; and
  a polarity of the first electrode and a polarity of the second electrode are different.

According to the third aspect of the present disclosure, there is provided a fabricating method of a shingled module, wherein the method includes the steps of:
  providing the electrically conducting interconnector of a shingled module stated above;
  laying at least two back-contacting solar cells that overlap on the electrically conducting interconnector, to obtain an assembly precursor, so that the first electric connector of the electrically conducting interconnector faces the first electrode of a back-contacting solar cell, and the second electric connector faces the second electrode of a back-contacting solar cell, wherein a polarity of the first electrode and a polarity of the second electrode are different; and laminating stacked members including the assembly precursor, so that the first electrode is conductively connected to the electrically conducting circuit of the electrically conducting interconnector via the first electric connector, and the second electrode is conductively connected to the electrically conducting circuit of the electrically conducting interconnector via the second electric connector.

The fabricating method of the electrically conducting interconnector, the shingled module and the fabricating method of a shingled module have the same or similar advantageous effects as those of the electrically conducting interconnector, which, in order to avoid replication, is not discussed herein further.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure, the figures that are required to describe the embodiments of the present disclosure will be briefly introduced below. Apparently, the figures that are described below are embodiments of the present disclosure, and a person skilled in the art can obtain other figures according to these figures without paying creative work.

DESCRIPTION OF THE REFERENCE NUMBERS

1—electrically conductive layer, 2—electric connectors, 21—first electric connector, 22—second electric connector, 3—back-contacting solar cell, 31—first electrode, 32—second electrode, 33—first diffusion region, 34—second diffusion region, 35—semiconductor substrate, 36—shorter sides, 37—chamfer, 311—first connecting electrodes, 312—first fine grid lines, 321—second connecting electrodes, 322—second fine grid lines, 4—insulating layer, 41—openings, 11—metal foil, 12—isolating region, 13—joining sites, 5—cover plate, 6—back plate, 7—sealing layer, and 8—pressure-resistant pad.

DETAILED DESCRIPTION

The technical solutions of the embodiments of the present disclosure will be clearly and completely described below with reference to the drawings of the embodiments of the present disclosure. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
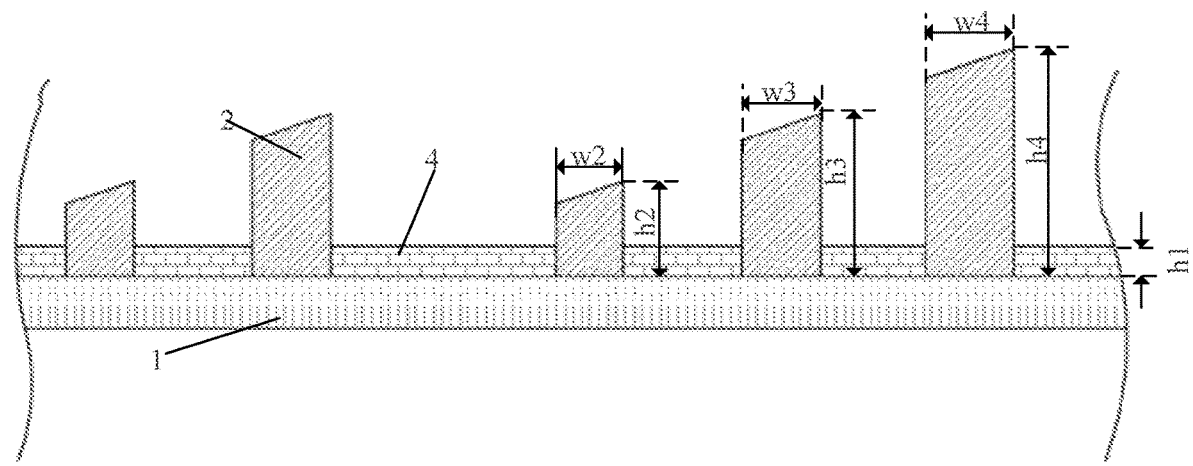
FIG. 1 shows a schematic structural diagram of an electrically conducting interconnector according to an embodiment of the present disclosure.

In an embodiment of the present disclosure, referring to FIG. 1, FIG. 1 shows a schematic structural diagram of an electrically conducting interconnector according to an embodiment of the present disclosure. The electrically conducting interconnector includes: an electrically conductive layer 1, and an insulating layer 4 and electric connectors 2 that are located on one side of the electrically conductive layer 1. The electrically conductive layer 1 has an electrically conducting circuit (not shown in FIG. 1).

Figure 2:
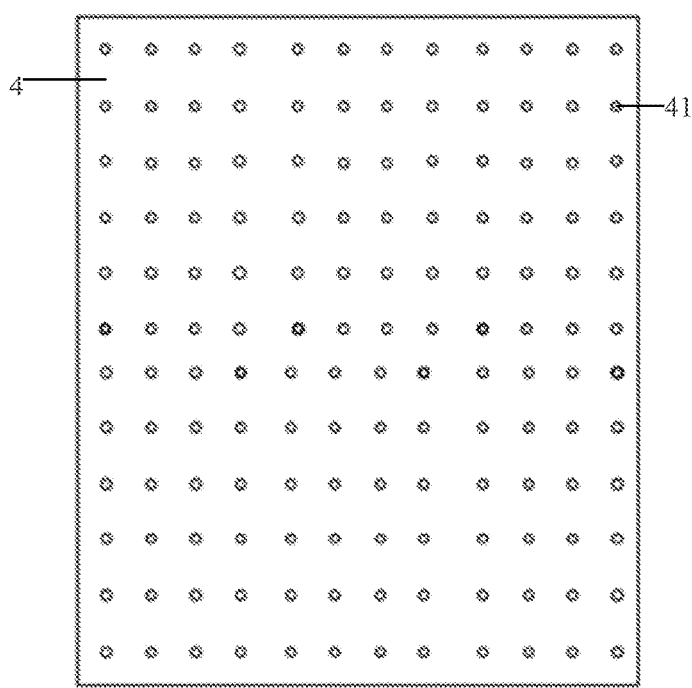
FIG. 2 shows a schematic structural diagram of an insulating layer according to an embodiment of the present disclosure.
Figure 3:
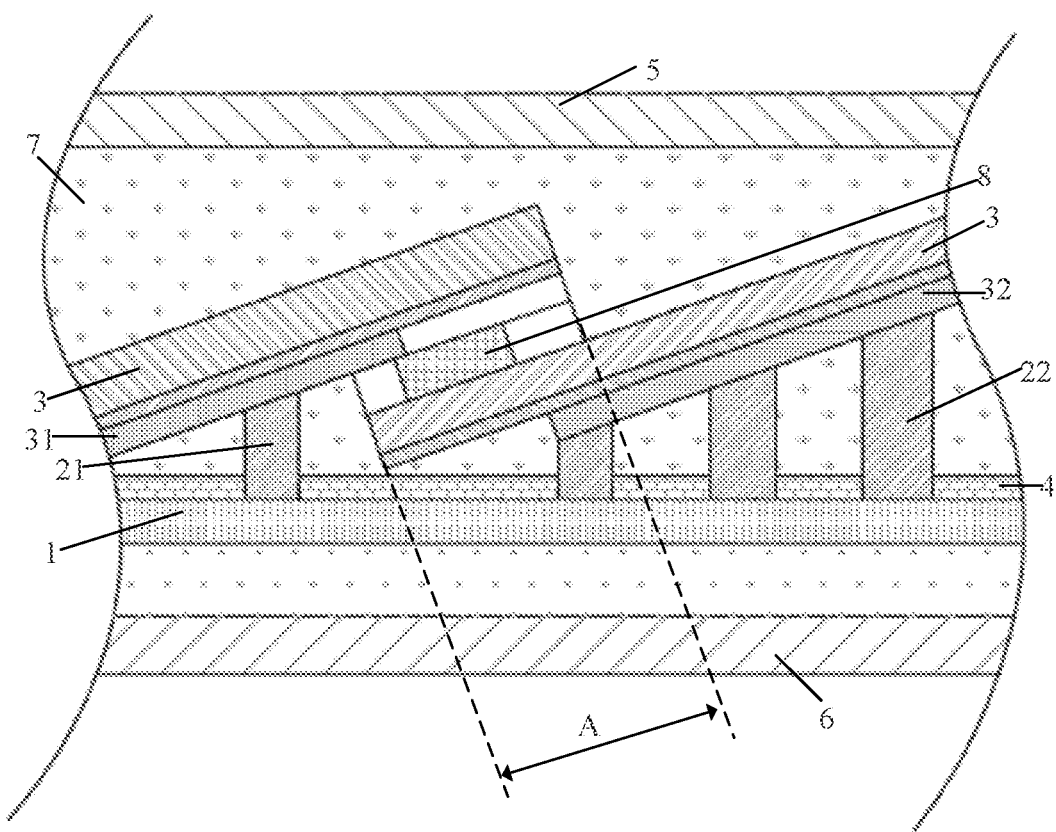
FIG. 3 shows a schematic structural diagram of a shingled module according to an embodiment of the present disclosure.

The insulating layer 4 and the electric connectors 2 are located on the same side of the electrically conductive layer 1. FIG. 2 shows a schematic structural diagram of an insulating layer according to an embodiment of the present disclosure. Referring to FIG. 2, the insulating layer 4 is provided with openings 41. Referring to FIG. 3, FIG. 3 shows a schematic structural diagram of a shingled module according to an embodiment of the present disclosure. The electric connectors 2 are located in the openings of the insulating layer 4. In other words, all of the electric connectors 2 protrude out of the electrically conductive layer 1, and protrude out of the openings of the insulating layer 4.

In the shingled module, two neighboring back-contacting solar cells 3 overlap. The size of the overlapping region is not particularly limited.

Referring to FIG. 3, the electric connectors include a first electric connector 21 and a second electric connector 22. The first electric connector 21 is configured for conductively connecting a first electrode 31 of a back-contacting solar cell 3 and the electrically conducting circuit in the electrically conductive layer 1. For example, the first electric connector 21 conductively connects the first electrode 31 within a non-overlapping region of one back-contacting solar cell 3 of the two back-contacting solar cells 3 that overlap and the electrically conducting circuit in the electrically conductive layer 1. For example, in FIG. 3, the back-contacting solar cell 3 on the left is conductively connected to the electrically conductive layer 1 via the first electric connector 21 and the first electrode 31. The second electric connector 21 is configured for conductively connecting a second electrode 32 of a back-contacting solar cell 3 and the electrically conducting circuit in the electrically conductive layer 1. For example, the second electric connector 21 conductively connects the second electrode 32 within a non-overlapping region of the other back-contacting solar cell 3 of the two back-contacting solar cells 3 that overlap and the electrically conducting circuit in the electrically conductive layer 1. For example, in FIG. 3, the back-contacting solar cell 3 on the right is conductively connected to the electrically conductive layer 1 via the second electric connector 22 and the second electrode 32. The polarity of the first electrode 31 and the polarity of the second electrode 32 are different. For example, the first electrode 31 is the negative electrode, and accordingly the second electrode 32 may be the positive electrode. Accordingly, the left and the right two back-contacting solar cells 3 are connected in series to the electrically conductive layer 1 via the first electric connector 21 and the second electric connector 22, to form a cell string that overlaps, which has a simple process. Moreover, the electrically conducting connector 2 protruding out of the electrically conductive layer 1 may serve to support against an external force to a certain extent, which may increase the strength of connection, reduce the risk of cracking of the cells or the assembly, and improve the reliability of the assembly.

It should be noted that the first electric connector is used to conductively connect the first electrode of one back-contacting solar cell, the second electric connector is used to conductively connect the second electrode of the same back-contacting solar cell, and the polarity of the first electrode and the polarity of the second electrode are different. The first electric connector is further used to conductively connect the first electrode of one back-contacting solar cell of two back-contacting solar cells that overlap, and the second electric connector is further used to conductively connect the second electrode of the other back-contacting solar cell of the two back-contacting solar cells that overlap.

The pattern of the electrically conducting circuit is configured so that the electrically conducting interconnector is capable of connecting in series a plurality of back-contacting solar cells, which facilitates to form a shingled module of the back-contacting solar cells.

Figure 4:
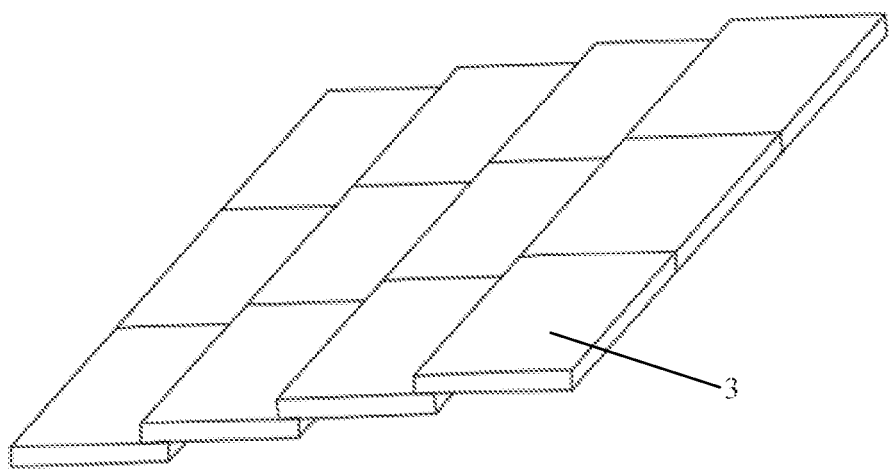
FIG. 4 shows a schematic structural diagram of the first type of back-contacting solar cells that overlap according to an embodiment of the present disclosure.
Figure 5:
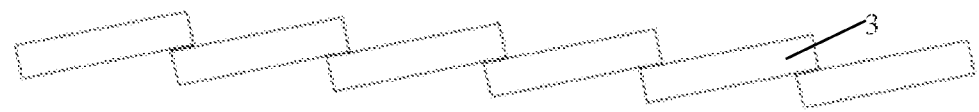
FIG. 5 shows a schematic structural diagram of the second type of back-contacting solar cells that overlap according to an embodiment of the present disclosure.

FIG. 4 shows a schematic structural diagram of the first type of back-contacting solar cells that overlap according to an embodiment of the present disclosure. FIG. 5 shows a schematic structural diagram of the second type of back-contacting solar cells that overlap according to an embodiment of the present disclosure. FIGS. 4 and 5 may be front views. Referring to FIGS. 3, 4 and 5, the back-contacting solar cells 3 overlap, which sufficiently utilizes the limited room in the assembly, increases the output power, reduces the assembly loss, and increases the conversion efficiency of the assembly.

It should be noted that an insulating gap is between the first electric connector 21 and the second electric connector 22. The shape of the surface of the first electric connector 21 that faces the first electrode 31 matches with the shape of the shadow face of the first electrode 31 of the back-contacting solar cells 3 that overlap, whereby they have a large contact area, which may ensure a good electric-conduction performance. The shape of the surface of the second electric connector 22 that faces the second electrode 32 matches with the shape of the shadow face of the second electrode 32 of the back-contacting solar cells 3 that overlap, whereby they have a large contact area, which may ensure a good electric-conduction performance.

All of the electrodes of the back-contacting solar cells are arranged at the shadow face, and the light facing face is used to collect sunlight radiation. The shadow faces of the back-contacting solar cells may also collect diffused light, which can realize the collection of sunlight at both faces. In the process of the overlapping, the shadow face of one back-contacting solar cell overlaps over the light facing face of another back-contacting solar cell. For example, referring to FIG. 3, the shadow face of the back-contacting solar cell 3 on the left overlaps over the light facing face of the back-contacting solar cell 3 on the right.

Figure 6:
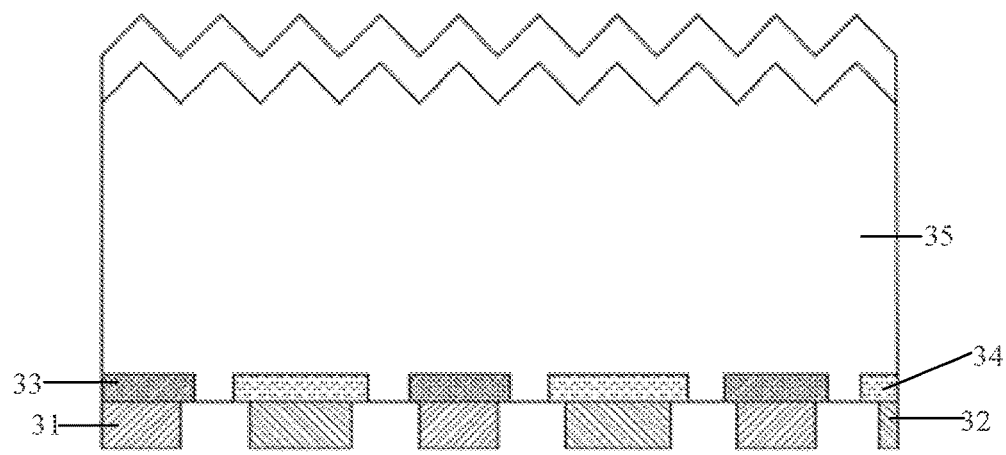
FIG. 6 shows a schematic structural diagram of the first type of a back-contacting solar cell according to an embodiment of the present disclosure.

FIG. 6 shows a schematic structural diagram of the first type of a back-contacting solar cell according to an embodiment of the present disclosure. Referring to FIG. 6, the back-contacting solar cell includes a first electrode 31 contacting a first diffusion region 33 and a second electrode 32 contacting a second diffusion region 34, and the first electrode 31 and the second electrode 32 are formed on the shadow face of a semiconductor substrate 35 and have an electric insulating gap therebetween. The polarity of the second electrode 32 and the polarity of the first electrode 31 are different.

Figure 7:
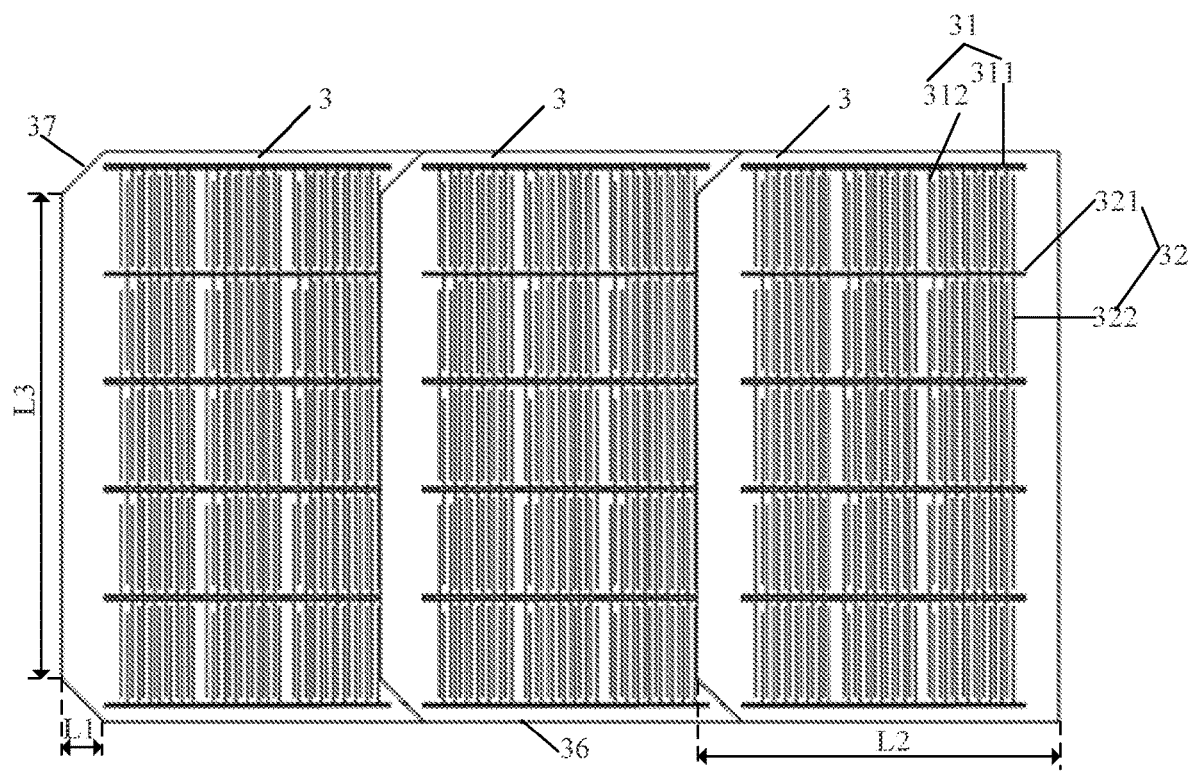
FIG. 7 shows a schematic structural diagram of the third type of back-contacting solar cells that overlap according to an embodiment of the present disclosure.

FIG. 7 shows a schematic structural diagram of the third type of back-contacting solar cells that overlap according to an embodiment of the present disclosure. FIG. 7 may be a bottom view looking from the shadow face to the light facing face. Referring to FIG. 7, the first electrode 31 is formed by first connecting electrodes 311 and first fine grid lines 312, the first fine grid lines 312 contact the first diffusion region 33 on the shadow face of the semiconductor substrate 35 in FIG. 6, and the first connecting electrodes 311 are connected to the first fine grid lines 312. The second electrode 32 is formed by second connecting electrodes 321 and second fine grid lines 322, the second fine grid lines 322 contact the second diffusion region 34 on the shadow face of the semiconductor substrate 35, and the second connecting electrodes 321 are connected to the second fine grid lines 322. The first electric connector may be conductively connected to the first connecting electrodes 311, and the second electric connector may be conductively connected to the second connecting electrodes 321.

The back-contacting solar cell may be a whole-sheet cell, and may also be sliced cells obtained by slicing a whole-sheet cell, which is not particularly limited in the embodiments of the present disclosure. One whole-sheet cell may be sliced into 2-10 sliced cells. The sliced cells may have substantially equal areas, widths, lengths and so on, which is not particularly limited in the embodiments of the present disclosure.

All of the electric connectors 2 protrude out of the electrically conductive layer 1, and protrude out of the openings of the insulating layer 4. Subsequently, the first electric connector 21 conductively connects the first electrode 31 of a back-contacting solar cell 3 and the electrically conducting circuit in the electrically conductive layer 1. The second electric connector 22 conductively connects the second electrode 32 of a back-contacting solar cell 3 and the electrically conducting circuit in the electrically conductive layer 1. Accordingly, the positions of the openings 41 of the insulating layer 4 are required to correspond to the positions of the first electrodes and the second electrodes of the back-contacting solar cells one to one. Regarding the same back-contacting solar cell, both of the first electric connector connecting the first electrode of the back-contacting solar cell and the second electric connector connecting the second electrode of the same back-contacting solar cell protrude out of the openings of the insulating layer 4, wherein the polarity of the first electrode and the polarity of the second electrode are different, and they are further electrically isolated by the insulating layer 4 not provided with an opening, which may avoid a short circuit between the first electrode and the second electrode of the same back-contacting solar cell. Moreover, the insulating layer 4 may also serve to support against an external force to a certain extent, which may increase the strength of connection, reduce the risk of cracking of the cells or the assembly, and improve the reliability of the assembly.

The insulating layer 4 is required to have a large insulation resistance, and further have a certain capacity of resisting thermal deformation, to enable the insulating layer 4 to have a low deformation in the process of lamination, which facilitates to ensure the aligning of the electrodes of the back-contacting solar cells with the electric connectors.

Optionally, the insulating layer is of a multilayer polymer structure that is obtained by combination of an insulating-material layer and a hot glued layer. The material of the insulating-material layer is selected from at least one of polyimide (PI), polyethylene naphthalate (PEN), polyethylene terephthalate (PET) and polypropylene (PP). The material of the hot glued layer is selected from at least one of etylene-vinyl acetate (EVA), polyvinyl butyral (PVB) and polyolefin (POE). The insulating layer of the above structure and materials has a good effect of insulation, has a low deformation in the process of lamination, and can be easily tapped.

Optionally, referring to FIG. 1, in the direction of the stacking of the electrically conductive layer 1 and the insulating layer 4, or the direction perpendicular to the electrically conductive layer 1, the thickness h1 of the insulating layer 4 is less than or equal to 500 μm. Preferably, the thickness h1 of the insulating layer 4 may be 50 μm-200 μm. The insulating layer 4 of such a thickness has advantages of a low cost, a good electric-insulation property and a low thermal deformation.

Within the overlapping region of neighboring back-contacting solar cells, when the heights of the electric connectors increase, the widths of the electric connectors gradually increase, wherein the heights refer to the dimensions of the electric connectors in the direction perpendicular to the electrically conductive layer. Accordingly, even if the height of a certain electric connector is large, because its width is also large, the resistance of that electric connector is not very large, which reduces the power consumption. Furthermore, the resistances of the electric connectors may have small differences or be equal, which facilitates the collection of the electric currents, and facilitates the reliable connection between the cell electrodes and the electrically conductive layer.

For example, referring to FIG. 1, in the direction perpendicular to the electrically conductive layer 1, the relation of the heights of the three electric connectors 2 on the right is: h4>h3>h2. Accordingly, in the direction parallel to the electrically conductive layer 1, the relation of the widths of the three electric connectors 2 on the right is: w4>w3>w2. Regarding the electric connector 2 of the height h4, although it has a greater height, its width is also large, and therefore its resistance is not very large, which reduces the power consumption. Furthermore, the resistances of the three electric connectors 2 of the heights h4, h3 and h2 may have small differences or be equal, which facilitates the collection of the electric currents, and facilitates the reliable connection between the cell electrodes and the electrically conductive layer 1.

Optionally, the material of the electric connectors is selected from at least one of an electrically conductive slurry, a solder, a soldering paste, an electrically conductive ink, an isotropic electrically conductive adhesive, an anisotropic electrically conductive adhesive, a metal, and a metal-alloy conductor. The electric connectors with such materials have a good electric-conduction performance. The shape of the electric connectors may be configured according to practical demands. For example, the shape of the electric connectors may be a cylinder, a block and so on, which is not particularly limited in the embodiments of the present disclosure.

Figure 8:
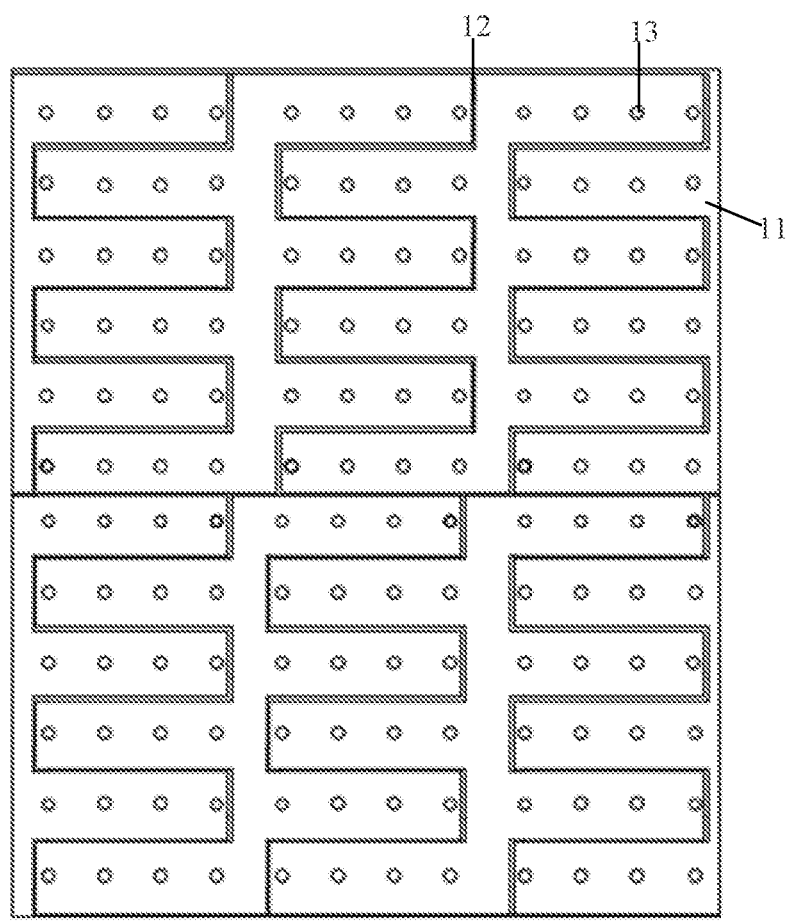
FIG. 8 shows a schematic structural diagram of the second type of an electrically conducting interconnector according to an embodiment of the present disclosure.

Optionally, the electrically conductive layer is a patterned metal foil or a plurality of electrically conducting lines that are provided on an adhesive film. For example, referring to FIG. 8, FIG. 8 shows a schematic structural diagram of an electrically conductive layer according to an embodiment of the present disclosure. The electrically conductive layer shown in FIG. 8 is a patterned metal foil. In FIG. 8, label 11 is the metal foil, and label 12 is the patterned isolating region. The width of the isolating region 12 is not particularly limited. The patterning process includes mechanical punching, laser punching and chemical etching. The pattern depends on the patterns of the electrodes at the shadow faces of the back-contacting solar cells, and the pattern may include various shapes and/or sizes. The metal foil may be a copper foil, an aluminum foil or any other suitable metal or metal alloy. For example, the main component of the metal foil may be at least one of copper, silver, aluminum, nickel, magnesium, iron, titanium, molybdenum and tungsten.

The thickness of the metal foil may be 10 μm-50 μm. The metal foil of such a thickness may provide a current passage of a low resistance. Joining sites 13 that correspond to the electrically conducting regions of the electrically conductive layer one to one may be provided in the metal foil 11, to facilitate the accurate aligning of the electrically conductive layers.

An embodiment of the present disclosure further provides a shingled module. The shingled module shown in FIG. 3 includes at least two back-contacting solar cells 3 that overlap. By using the first electric connector 21 of the electrically conducting interconnector according to any one of the above embodiments, the first electrode 31 of a back-contacting solar cell 3 and the electrically conducting circuit of the electrically conducting interconnector according to any one of the above embodiments are conductively connected. By using the second electric connector 22 of the electrically conducting interconnector according to any one of the above embodiments, the second electrode 32 of a back-contacting solar cell 3 and the electrically conducting circuit are conductively connected. The polarity of the first electrode and the polarity of the second electrode are different.

The back-contacting solar cells and the electrically conducting interconnector in the shingled module may refer to the above relevant description, which, in order to avoid replication, is not discussed herein further. The shingled module can realize the same or similar advantageous effects as those of the electrically conducting interconnector.

Referring to FIG. 7, each of the back-contacting solar cells 3 includes shorter sides 36 that are parallel to the direction of the series connection of the back-contacting solar cells or parallel to the cell string formed by the back-contacting solar cells, and in the direction parallel to the shorter sides 36, the dimension L1 of the overlapping region of the two back-contacting solar cells that overlap is 5%-50% of the length L2 of the shorter sides 36. Because the electrodes within the overlapping region usually cannot be connected in series to the electrically conductive layer, or a current loss is large during the process of connecting in series to the electrically conductive layer, such a size of the overlapping region enables the remaining non-overlapping region to have a large area, and accordingly a large number of the electrodes are connected in series to the electrically conductive layer 1, which alleviates the problem of incapability of collection of the currents caused by the overlapping.

For example, referring to FIG. 7, the first electrode 31 is formed by first connecting electrodes 311 and first fine grid lines 312, and the first connecting electrodes 311 are connected to the first fine grid lines 312. The first electric connector conductively connects the first connecting electrodes 311 of the back-contacting solar cell. The first connecting electrodes 311 are parallel to the direction of the series connection of the back-contacting solar cells or parallel to the cell string formed by the back-contacting solar cells, and the direction of the shorter sides are parallel to the first connecting electrodes 311.

Optionally, in the direction parallel to the shorter sides of the back-contacting solar cells, the dimension of the overlapping region of the two back-contacting solar cells that overlap is 0.3 mm-3 mm. For example, referring to FIG. 3, in the direction parallel to the shorter sides of the back-contacting solar cells 3, the dimension A of the overlapping region of the two back-contacting solar cells 3 that overlap is 0.3 mm-3 mm. The overlapping region of such a dimension enables the overlapping of the two back-contacting solar cells to be reliable. Moreover, because the electrodes within the overlapping region usually cannot be connected in series to the electrically conductive layer 1, or the current loss is large during the process of connecting in series to the electrically conductive layer 1, such a size of the overlapping region enables the remaining non-overlapping region to have a large area, and accordingly a large number of the electrodes are connected in series to the electrically conductive layer 1, which alleviates the problem of incapability of collection of the currents caused by the overlapping.

It should be noted that the area of the overlapping region of the two back-contacting solar cells that overlap may be decided by the length L3 of the longer sides of the back-contacting solar cells and the dimension L1 of the overlapping region of the two back-contacting solar cells that overlap in the direction parallel to the shorter sides 36. When the electrodes are provided within the overlapping region, if the area of the overlapping region is smaller, the problem of incapability of collection of the currents caused by the intersection or overlapping is more alleviated.

Optionally, the overlapping region of the two back-contacting solar cells that overlap includes a non-electrode region within which no electrode is provided. Because the electrodes within the overlapping region usually cannot be connected in series to the electrically conductive layer, or the current loss is large during the process of connecting in series to the electrically conductive layer, by the overlapping region including the non-electrode region within which no electrode is provided, the output loss from the electrode resistance may be reduced. Moreover, when the back-contacting solar cells are connected by lamination, the decreasing of the photoelectric conversion efficiency of the back-contacting solar cells caused by the dark current generated within the overlapping region is reduced, which may increase the output power of the shingled module.

It should be noted that, within the overlapping region, the first electrode or the second electrode within the electrode region provided with the electrodes is formed adjacently to the non-electrode region.

Optionally, the area of the non-electrode region of the overlapping region of the two back-contacting solar cells that overlap is 50%-90% of the area of the overlapping region. Accordingly, the electrodes are not provided within most of the overlapping region, which may further reduce the output loss from the electrode resistance. Moreover, when the back-contacting solar cells are connected by lamination, the decreasing of the photoelectric conversion efficiency of the back-contacting solar cells caused by the dark current generated within the overlapping region is further reduced, which may increase the output power of the shingled module.

Optionally, referring to FIG. 3, the shingled module further includes a pressure-resistant pad 8 that is located within the overlapping region of the two back-contacting solar cells that overlap. The Young's modulus of the pressure-resistant pad 8 is greater than 5 Mpa. The pressure-resistant pad 8 may absorb stress, reduce hidden cracking, and improve the reliability of the assembly.

The shape of the pressure-resistant pad 8 is not particularly limited. For example, the shape of the pressure-resistant pad 8 may be a circle and so on. The pressure-resistant pad 8 may be a continuous whole strip, and may also be discontinuous strips, which is not particularly limited in the embodiments of the present disclosure.

Optionally, the material of the pressure-resistant pad is selected from at least one of an epoxy resin, an acrylate, silicone, imide, bismaleimide, siloxane, vinyl acetate, polyolefin, polyimide, an acrylate, polyurethane, a cyanoacrylate, and phenolic resin. The pressure-resistant pad of such materials does not only have a good effect of stress absorption, but also has a low cost. Moreover, the pressure-resistant pad of such materials has a certain property of adhesive bonding, and may serve to adhesively bond two back-contacting solar cells that overlap, to improve the reliability of the intersection or overlapping.

Optionally, the pressure-resistant pad is an adhesive tape, the adhesive tape includes a backlining layer, an adhesive is applied on one side of the backlining layer, and the material of the backlining layer is selected from one of paper, a polymer film, cloth and a metal foil. The pressure-resistant pad of such materials does not only have a good effect of stress absorption, but also has a low cost. Moreover, the pressure-resistant pad of such materials has a certain property of adhesive bonding, and may serve to adhesively bond two back-contacting solar cells that overlap, to improve the reliability of the intersection or overlapping.

It should be noted that it is not particularly limited whether the pressure-resistant pad is electrically conductive. For example, the pressure-resistant pad may not be electrically conductive, and thus has a low cost.

Optionally, the first electrode is formed by bonding pads and grid lines that connect neighboring bonding pads, and the first electric connector conductively connects the bonding pads of the first electrode, whereby the electrically conductive connection is reliable. For example, the first connecting electrodes of the first electrode are formed by the bonding pads and the grid lines that connect the neighboring bonding pads, and the first electric connector conductively connects the bonding pads of the first connecting electrodes.

Additionally or alternatively, the second electrode is formed by bonding pads and grid lines that connect neighboring bonding pads, and the second electric connector conductively connects the bonding pads of the second electrode, whereby the electrically conductive connection is reliable. Regarding the electrically conducting interconnector including the insulating layer, the positions of the openings of the insulating layer correspond to the bonding pads one to one. For example, the second connecting electrodes of the second electrode are formed by bonding pads and grid lines that connect neighboring bonding pads, and the second electric connector conductively connects the bonding pads of the second connecting electrodes.

Figure 9:
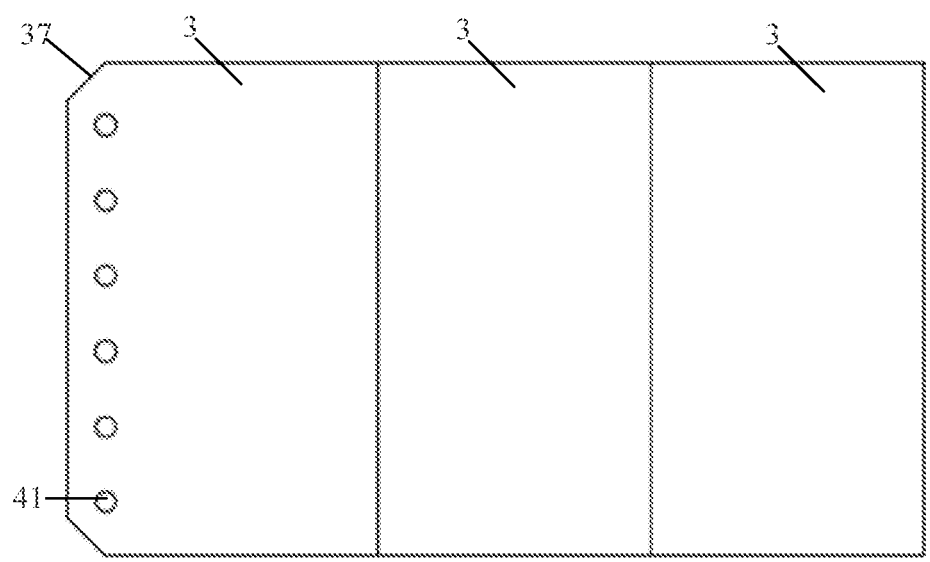
FIG. 9 shows a schematic structural diagram of the fourth type of back-contacting solar cells that overlap according to an embodiment of the present disclosure.

Optionally, referring to FIG. 7, one end of each of the back-contacting solar cells 3 is provided with a chamfer 37, and the other end is not provided with a chamfer. Referring to FIG. 9, FIG. 9 shows a schematic structural diagram of the fourth type of back-contacting solar cells that overlap according to an embodiment of the present disclosure. FIG. 9 may be a diagram viewed from the light facing face to the shadow face of the back-contacting solar cells that overlap shown in FIG. 7. In the shingled module, the one end of each of the back-contacting solar cells 3 that is not provided with a chamfer overlaps over the one end of another of the back-contacting solar cells 3 that is provided with a chamfer 37. Accordingly, the end provided with the chamfer is pressed under the end not provided with a chamfer, and the chamfer cannot be seen from the light facing face, which may improve the aesthetics of the shingled module. In FIG. 9, label 11 denotes the openings in the insulating layer.

Optionally, referring to FIG. 3, the shingled module further includes: a cover plate 5 located at the light facing faces of the back-contacting solar cells 3, and a back plate 6 located at the shadow faces of the back-contacting solar cells 3. A sealing layer 7 is provided between the cover plate 5 and the back plate 6 and around the back-contacting solar cells 3. The material of the sealing layer 7 is selected from at least one of ethylene-vinyl acetate copolymer (EVA), ethylene/α-olefin copolymer, polyvinyl butyl ester (PVB), acrylic resin, polyurethane resin, and silicone resin. The sealing layer of such materials can serve to absorb stress well, reduce hidden cracking, and improve the reliability of the assembly.

The shape of the sealing layer 7 is particularly adapted for the shape between the cover plate 5 and the back plate 6 and around the back-contacting solar cells 3, and may be sheet-like and so on, which is not particularly limited in the embodiments of the present disclosure.

It should be noted that the cover plate 5 located at the light facing face of the back-contacting solar cells 3 and the sealing layer 7 located at the light facing face of the back-contacting solar cells 3 are light-transmittable. The material of the sealing layer 7 may be a liquid or a solid. The sealing material may be separately added, and may flow to the overlapping region in the lamination. The sealant is solidified or laminated to encapsulate the shingled module, and the back-contacting solar cells are bonding between the back plate and the transparent cover plate to form a stacked member. The final stacked member may be installed with a frame to fabricate the shingled module. The encapsulating agent for the shingled module may provide electric insulation, reduce moisture intrusion, and protect the shingled module from mechanical stress and/or corrosion.

The material of the cover plate is selected from materials that are light-transmittable but resistant to ultraviolet rays, for example, glass or a transparent resin such as acrylic resin and polycarbonate resin. The back plate may be a material that prevents invasion by water and so on (having a high water tightness), for example, polyethylene terephthalate (PET), polyethylene (PE), olefin resin, a resin film such as fluorine containing resin or silicone containing resin, a light-transmittable plate-like resin member such as glass, polycarbonate and acrylic acid, and a stacked body of metal foils such as an aluminum foil.

Optionally, the shingled module may further include a front anti-reflection layer located at a light facing face of the cover plate, to reduce light reflection. The light facing face and/or the shadow face of the cover plate may have a light trapping structure, to increase the optical path. For example, the light facing face and/or the shadow face of the cover plate may be processed to be uneven, so as to guide more light into the photovoltaic assembly.

An embodiment of the present disclosure further provides a fabricating method of a shingled module, wherein the method includes the following steps:

Step SA1: providing the electrically conducting interconnector according to any one of the above embodiments.

Step SA2: laying at least two back-contacting solar cells that overlap on the electrically conducting interconnector, to obtain an assembly precursor, so that the first electric connector of the electrically conducting interconnector faces the first electrode of a back-contacting solar cell, and the second electric connector faces the second electrode of a back-contacting solar cell, wherein a polarity of the first electrode and a polarity of the second electrode are different.

Step SA3: laminating the stacked members including the assembly precursor, so that the first electrode is conductively connected to the electrically conducting circuit of the electrically conducting interconnector via the first electric connector, and the second electrode is conductively connected to the electrically conducting circuit of the electrically conducting interconnector via the second electric connector.

In the stacked member including the assembly precursor, the sealing layer and the cover plate may be laid at the light facing face of the assembly precursor, and the sealing layer and the back plate may be laid at the shadow face of the assembly precursor. The parts of the shingled module refer to the above relevant description, and may reach the similar advantageous effects, which, in order to avoid replication, is not discussed herein further.

The embodiments of the present disclosure are described above with reference to the drawings. However, the present disclosure is not limited to the above particular embodiments. The above particular embodiments are merely illustrative, rather than limitative. A person skilled in the art, under the motivation of the present disclosure, can make many variations without departing from the spirit of the present disclosure and the protection scope of the claims, and all of the variations fall within the protection scope of the present disclosure.

The above-described device embodiments are merely illustrative, wherein the units that are described as separate components may or may not be physically separate, and the components that are displayed as units may or may not be physical units; in other words, they may be located at the same location, and may also be distributed to a plurality of network units. Some or all of the modules may be selected according to the actual demands to realize the purposes of the solutions of the embodiments. A person skilled in the art can understand and implement the technical solutions without paying creative work.

The "one embodiment", "an embodiment" or "one or more embodiments" as used herein means that particular features, structures or characteristics described with reference to an embodiment are included in at least one embodiment of the present disclosure. Moreover, it should be noted that here an example using the wording "in an embodiment" does not necessarily refer to the same embodiment.

The description provided herein describes many concrete details. However, it can be understood that the embodiments of the present disclosure may be implemented without those concrete details. In some of the embodiments, well-known processes, structures and techniques are not described in detail, so as not to affect the understanding of the description.

In the claims, any reference signs between parentheses should not be construed as limiting the claims. The word "comprise" does not exclude elements or steps that are not listed in the claims. The word "a" or "an" preceding an element does not exclude the existing of a plurality of such elements. The present disclosure may be implemented by means of hardware including several different elements and by means of a properly programmed computer. In unit claims that list several devices, some of those devices may be embodied by the same item of hardware. The words first, second, third and so on do not denote any order. Those words may be interpreted as names.

Finally, it should be noted that the above embodiments are merely intended to explain the technical solutions of the present disclosure, and not to limit them. Although the present disclosure is explained in detail with reference to the above embodiments, a person skilled in the art should understand that he can still modify the technical solutions set forth by the above embodiments, or make equivalent substitutions to part of the technical features of them. However, those modifications or substitutions do not make the essence of the corresponding technical solutions depart from the spirit and scope of the technical solutions of the embodiments of the present disclosure.

The invention claimed is:

1. An electrically conducting interconnector of a shingled module, wherein the electrically conducting interconnector comprises: an electrically conductive layer, an insulating layer and electric connectors that are located on one side of the electrically conductive layer, and at least two back-contacting solar cells, wherein two neighboring back-contacting solar cells partially overlap on the electrically conducting interconnector;
the electrically conductive layer is provided with an electrically conducting circuit;
the insulating layer is provided with openings, and the electric connectors are located in the openings of the insulating layer;
the electric connectors include a first electric connector and a second electric connector;
the first electric connector is configured for conductively connecting a first electrode of a back-contacting solar cell and the electrically conducting circuit;
the second electric connector is configured for conductively connecting a second electrode of a back-contacting solar cell and the electrically conducting circuit;
a polarity of the first electrode and a polarity of the second electrode are different;
between overlapping regions of the neighboring back-contacting solar cells, widths of the electric connectors increase with increase of heights of the electric connectors, wherein the heights refer to dimensions of the electric connectors in a direction perpendicular to the electrically conductive layer; and
a pattern of the electrically conducting circuit is configured so that the electrically conducting interconnector is capable of connecting in series a plurality of back-contacting solar cells.

2. The electrically conducting interconnector of a shingled module according to claim 1, wherein a material of the electric connectors is selected from at least one of an electrically conductive slurry, a solder, a soldering paste, an electrically conductive ink, an isotropic electrically conductive adhesive, an anisotropic electrically conductive adhesive, a metal, and a metal-alloy conductor.

3. The electrically conducting interconnector of a shingled module according to claim 1, wherein the insulating layer is of a multilayer polymer structure that is obtained by combination of an insulating-material layer and a hot glued layer.

4. The electrically conducting interconnector of a shingled module according to claim 1, wherein a thickness of the insulating layer is less than or equal to 500 μm.

5. The electrically conducting interconnector of a shingled module according to claim 1, wherein the electrically conductive layer is a patterned metal foil or a plurality of electrically conducting lines that are provided on an adhesive film; and
a thickness of the metal foil is 10 μm-50 μm.

6. A shingled module, wherein the shingled module comprises at least two back-contacting solar cells that overlap;
the first electrode of the back-contacting solar cell and the electrically conducting circuit of the electrically conducting interconnector of a shingled module according to claim 1 are conductively connected by the first electric connector of the electrically conducting interconnector of the shingled module according to claim 1;
the second electrode of the back-contacting solar cell and the electrically conducting circuit are conductively connected by the second electric connector of the electrically conducting interconnector of the shingled module according to claim 1; and
a polarity of the first electrode and a polarity of the second electrode are different.

7. The shingled module according to claim 6, wherein a dimension of an overlapping region of the two back-contacting solar cells that overlap is 5%-50% of a dimension of a shorter side.

8. The shingled module according to claim 7, wherein in a direction parallel to the shorter side, the dimension of the overlapping region of the two back-contacting solar cells that overlap is 0.3 mm-3 mm.

9. The shingled module according to claim 6, wherein the overlapping region of the two back-contacting solar cells that overlap comprises a non-electrode region within which no electrode is provided.

10. The shingled module according to claim 9, wherein an area of the non-electrode region is 50%-90% of the area of the overlapping region.

11. The shingled module according to claim 6, wherein the shingled module further comprises a pressure-resistant pad that is located within the overlapping region of the two back-contacting solar cells that overlap; and
a Young's modulus of the pressure-resistant pad is greater than 5 Mpa.

12. The shingled module according to claim 11, wherein a material of the pressure-resistant pad is selected from at least one of an epoxy resin, an acrylate, silicone, imide, bismaleimide, siloxane, vinyl acetate, polyolefin, polyimide, an acrylate, polyurethane, a cyanoacrylate, and phenolic resin.

13. The shingled module according to claim 11, wherein the pressure-resistant pad is an adhesive tape, the adhesive tape comprises a backlining layer, an adhesive is applied on one side of the backlining layer, and a material of the backlining layer is selected from one of paper, a polymer film, cloth and a metal foil.

14. The shingled module according to claim 6, wherein the first electrode is formed by bonding pads and grid lines that connect neighboring bonding pads, and the first electric connector conductively connects the bonding pads of the first electrode;

and/or the second electrode is formed by bonding pads and grid lines that connect neighboring bonding pads, and the second electric connector conductively connects the bonding pads of the second electrode.

15. The shingled module according to claim 6, wherein one end of each of the back-contacting solar cells is provided with a chamfer, and the other end of each of the back-contacting solar cells is not provided with a chamfer; and in the shingled module, the end of each of the back-contacting solar cells that is not provided with a chamfer overlaps over the end of another of the back-contacting solar cells that is provided with a chamfer.

16. The shingled module according to claim 6, wherein the shingled module further comprises: a cover plate located at light facing faces of the back-contacting solar cells, and, a back plate located at shadow faces of the back-contacting solar cells;

a sealing layer is provided between the cover plate and the back plate and disposed around the back-contacting solar cells; and a material of the sealing layer is selected from at least one of ethylene-vinyl acetate copolymer, ethylene/α-olefin copolymer, polyvinyl butyl ester, acrylic resin, polyurethane resin, and silicone resin.

17. The shingled module according to claim 16, wherein the shingled module further comprises: a front anti-reflection layer located at a light facing face of the cover plate; and the light facing face and/or a shadow face of the cover plate is provided with a light trapping structure.

* * * * *